(12) United States Patent
Bertsch et al.

(10) Patent No.: US 8,011,932 B2
(45) Date of Patent: Sep. 6, 2011

(54) METHOD FOR CONTACTING PARTIALLY CONDUCTIVE TEXTILE MATERIALS

(75) Inventors: Michael Steffen Bertsch, Heilbronn (DE); Michael Grimm, Mosbach (DE)

(73) Assignee: Amphenol-Tuchel Electronics GmbH (DE)

( * ) Notice: Subject to any disclaimer, the term of this patent is extended or adjusted under 35 U.S.C. 154(b) by 220 days.

(21) Appl. No.: 11/989,637

(22) PCT Filed: Jul. 28, 2006

(86) PCT No.: PCT/EP2006/007505
§ 371 (c)(1),
(2), (4) Date: Nov. 9, 2009

(87) PCT Pub. No.: WO2007/014718
PCT Pub. Date: Feb. 8, 2007

(65) Prior Publication Data
US 2010/0048066 A1  Feb. 25, 2010

(30) Foreign Application Priority Data
Jul. 29, 2005  (DE) .......................... 10 2005 035 754

(51) Int. Cl.
*H01R 12/00*  (2006.01)

(52) U.S. Cl. ......................................... 439/59; 439/495
(58) Field of Classification Search ..................... 439/59, 439/465, 493, 497, 77, 696
See application file for complete search history.

(56) References Cited

U.S. PATENT DOCUMENTS

| 4,639,054 A | * | 1/1987 | Kersbergen ..................... 439/59 |
| 4,679,868 A | * | 7/1987 | Hasircoglu ..................... 439/495 |
| 2004/0244193 A1 | | 12/2004 | Jung et al. |
| 2004/0266244 A1 | | 12/2004 | Jung et al. |

FOREIGN PATENT DOCUMENTS

| DE | 10049397 | 10/2001 |
| DE | 10161527 | 7/2003 |
| WO | WO 86/02204 | 4/1986 |
| WO | WO 2005/067042 A1 | 7/2005 |

OTHER PUBLICATIONS

International Search Report, mailed Oct. 27, 2006.

* cited by examiner

*Primary Examiner* — Khiem Nguyen
(74) *Attorney, Agent, or Firm* — Blank Rome LLP

(57) ABSTRACT

A method for electrically connecting conductive thread (40) at any number of termination locations of a textile material (5) with an termination element preferably formed in a circuit board with the following steps being provided: placing the circuit board in a respectively formed recess of a support plate of a tool with the termination locations (122) of the circuit board (12) facing upwardly; arranging the material (5) on the circuit board (12) such that in the area of the termination locations of the circuit board (12) a termination location of the material (5) which is to be connected is being placed. Fixedly mounting, preferably by clamping the material adjacent to and on a side of the termination locations of the circuit board, preferably stretching the material (5) in longitudinal direction wherein the direction of the extension of the conductive threads. Fixedly clamping the material in an area opposite to the first clamping area and adjacent to the desired termination location. Soldering the blank conductive threads (40) to the termination locations of the circuit board (12).

7 Claims, 5 Drawing Sheets

US 8,011,932 B2

METHOD FOR CONTACTING PARTIALLY CONDUCTIVE TEXTILE MATERIALS

BACKGROUND OF THE INVENTION

1. Field of the Invention

The present invention relates to a method for connecting partially conductive textile materials. The invention also relates to a connector for connecting the electrically conducting threads of the material.

2. Background of the Related Art

Partially conductive textile material comprises of generally non-conductive textile threads which extend in a longitudinal direction and in a vertical or transversal direction, with said material also having electrically conducting threads (threads/wires) which generally extend in a horizontal direction between the textile threads.

Due to the structure of the textile material, the distances or spacing between the conductive threads (threads/wires) are not perfectly (100%) defined.

It is already known to make the conductive threads at an end of a textile material manually accessible so a termination element can be connected by means of soldering at the ends of the exposed conductive threads (threads/wires). But that method requires excessive effort and does not lead to precise alignment, which is typically required in a termination element.

Attention is drawn to DE 101 61 527 A1, which discloses a design and connecting technique for textile structures. According to one embodiment, textile material into which a plurality of electric conductors are woven is used, wherein each conductor comprises a plurality of electrically conducting threads. To electrically connect the conductors located within the textile material with the contact points of an electronic component, the textile material is initially positioned relative to the conductors such that the conductors are located immediately adjacent to the contact points of the electronic component. For that purpose, adjustment means are provided in the textile material. The conductors that are in abutment with the contact points after the positioning step need to be pressed. The pressing step of the conductors at the contacting points has to be carried out such that the molten insulation of the electrically conductive threads (threads/wires) as well as the electrically insulating material, which may be present, are pushed away. According to another embodiment, an electronic component is not immediately connected with the electric conductors, but instead is connected by means of a flexible circuit board on which copper paths or traces are provided. In an area where the conductors extend over the copper paths, the non-conductive threads can be removed so as to get better access to the electrically conducting threads to obtain a better electrical contact.

SUMMARY OF THE INVENTION

The present invention intends to provide a method by means of which partially conductive textile materials, preferably materials that are elastic in the longitudinal direction, can be contacted precisely and at low cost. The contacting is preferably carried out at a termination location or contact region of the textile material without damaging the material.

The present invention further provides for a termination element, in particular for partially conductive materials, and for a connector for partially conductive textile materials.

In accordance with the present invention, connecting (terminating) a partially conductive textile material to a termination contact region is achieved by clamping the material adjacent to a desired location of the termination contact region and tensioning the material or, in the case of an elastic material, stretching the material to elongate the material. If the material is of a strip like design, then the tensioning or elongating of the material occurs such that the conductive wires/threads (conductive threads) are aligned. With the partially conductive textile material in the stretched and elongated condition, the non-conductive textile threads are transversely cut or severed. Then, the area or region of stretching and elongating is heated. Thereupon, a step of blowing away the heated non-conductive textile threads is provided such that the conductive threads/wires are exposed in the stretched area and area of elongation.

By suitably selecting the temperature of soldering, a separate step of heating and blowing away can be omitted and the heat of the soldering operation can be used to place the conductive threads in an exposed condition. Due to the the elongated and stretched nature of the partially conductive textile material, non-conductive textile threads will withdraw the moment of the thermal melting to expose the area of contact (contacting region).

At the time the non-conductive textile threads are cut, preferably by means of teeth arranged in a direction parallel to the transverse direction of the non-conductive textile threads, the conductive threads/wires (conductive threads) are stretched parallel to each other. And the tension created by the spreading of the partially conductive textile material results in a uniform spacing of the conductive threads/wires (conductive threads).

The present invention further relates to a termination element in the form of a printed circuit board on which spaced conductive paths or traces are placed. The conductive traces have greater width in the contact region of the conductive threads/wires.

Further, the present invention provides for a connector that is adapted to receive said termination element, wherein said connector receives a portion of the termination element with the conductive threads/wires in a connector space.

BRIEF DESCRIPTION OF THE FIGURES

Further advantages, objects and details of the invention can be found in the description of the embodiments referring to the drawings, in which:

FIGS. 9, 10, and 11 illustrated the method steps when working on the partially conductive textile material, wherein FIG. 9 is a cross-sectional view of the material in substance along line 9-9 shown in FIG. 7 FIG. 10 is a cross-sectional view of a plurality of teeth arranged in a row and the textile material that is to be cut apart adjacent to the conductive threads/wires, and FIG. 11 shows the textile material after being cut.

DETAILED DESCRIPTION OF THE PREFERRED EMBODIMENTS

Figure 1:
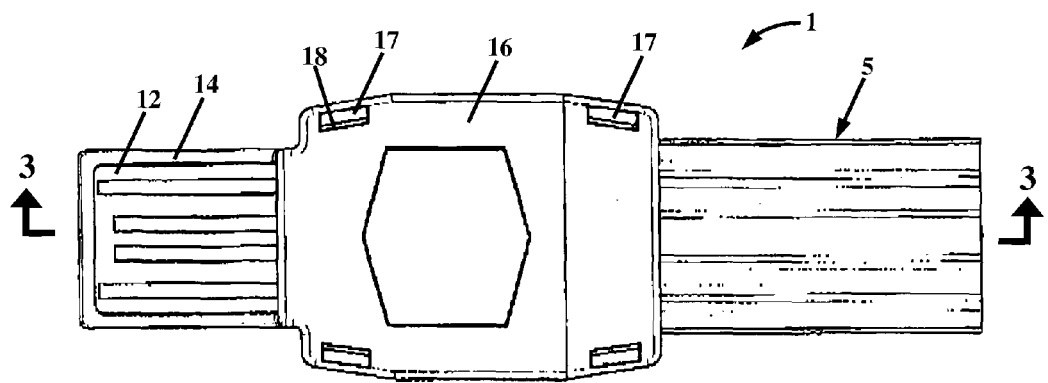
FIG. 1 is a top plan view of a part of a partially conductive textile material with a connector mounted thereto.
Figure 2:
FIG. 2 is a side elevational view of the material with a connector mounted thereto in accordance with FIG. 1.
Figure 3:
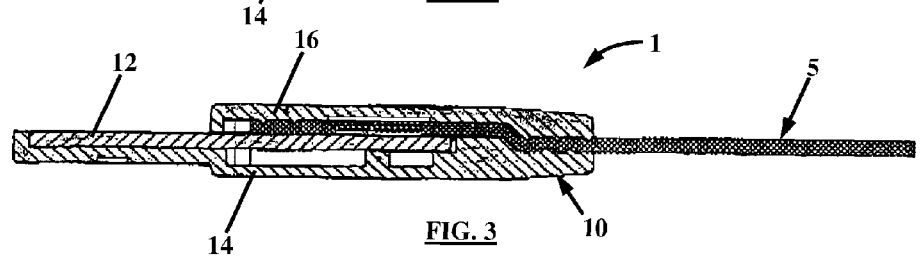
FIG. 3 is a sectional view along line 3-3 shown in FIG. 1.

FIGS. 1, 2, 3, 4, and 5 disclose a connector designed in accordance with the present invention. The connector 1 comprises a housing 10 and a termination element in the form of a printed circuit board 12. The connector 1 is adapted to connect to a partially conductive textile material (called "material" in the following discussion) 5. The material 5 is preferably provided in the form of a strip. The material is comprised of conductive and possibly non-conductive threads that extend in the longitudinal direction and non-conductive threads that extend in transverse direction. Moreover the material 5 is preferably elastic in the longitudinal direction.

The housing 10 comprises a lower part 14 and an upper part or cover 16 with the lower part 14 being adapted to receive the printed circuit board 12. At the lower part 14, locking noses 17 are provided that can lockingly engage receiving slots 18 of the cover 16.

The lower part 14 forms a recess 19 that is adapted to receive the printed circuit board 12. Further, the lower part 14 forms support surfaces 20, 21, 22, 23 and 24 for supporting the circuit board.

The lower part 14 provides first teeth 26 that cooperate with second teeth 34 provided at the cover 16 The second teeth 34 extend into an entrance opening for the material 5. Moreover, third teeth 33 are provided in the cover 16 and extend inwardly adjacent to the support surface 29 at an exit opening of the connector 1. The third teeth 33 are similar to the first and second teeth 24 and 34 in that they penetrate into the material 5 and hold it in place.

Figure 5:
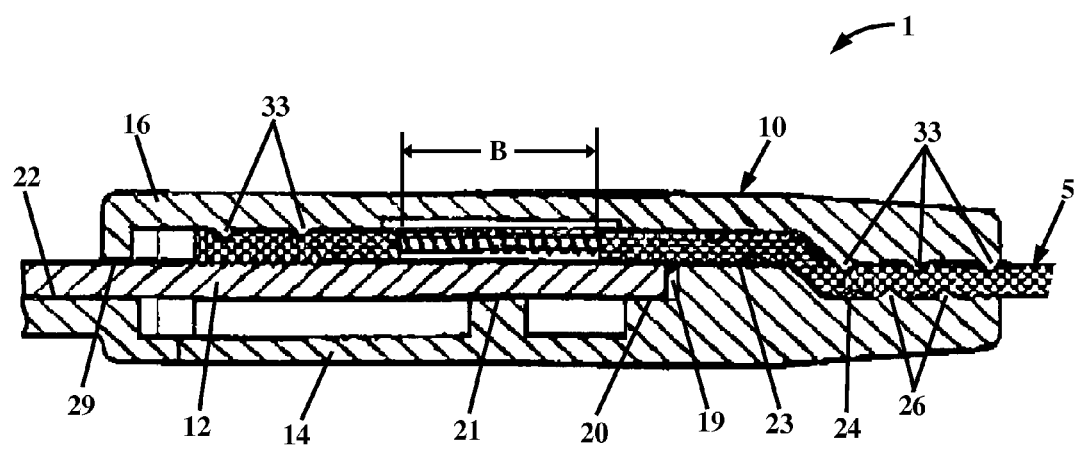
FIG. 5 shows a detail of FIG. 3.

FIG. 5 discloses a contact region with width B within which the conductive threads/wires 40 are accessible.

Figure 6:
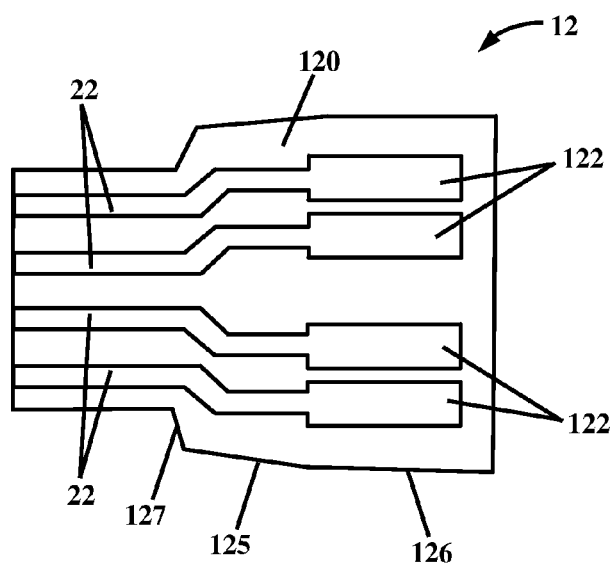
FIG. 6 is a top plan view of the printed circuit board (termination element) as it is used, for example, in FIGS. 1, 3, and 4.

FIG. 6 discloses a printed circuit board (termination element) 12. The printed circuit board 12 comprises an insulation plate 120 on which, in this case, four conductive traces 121 are provided that widen toward four connecting tabs 122 that are configured to be connected to the material 5.

Figure 7:
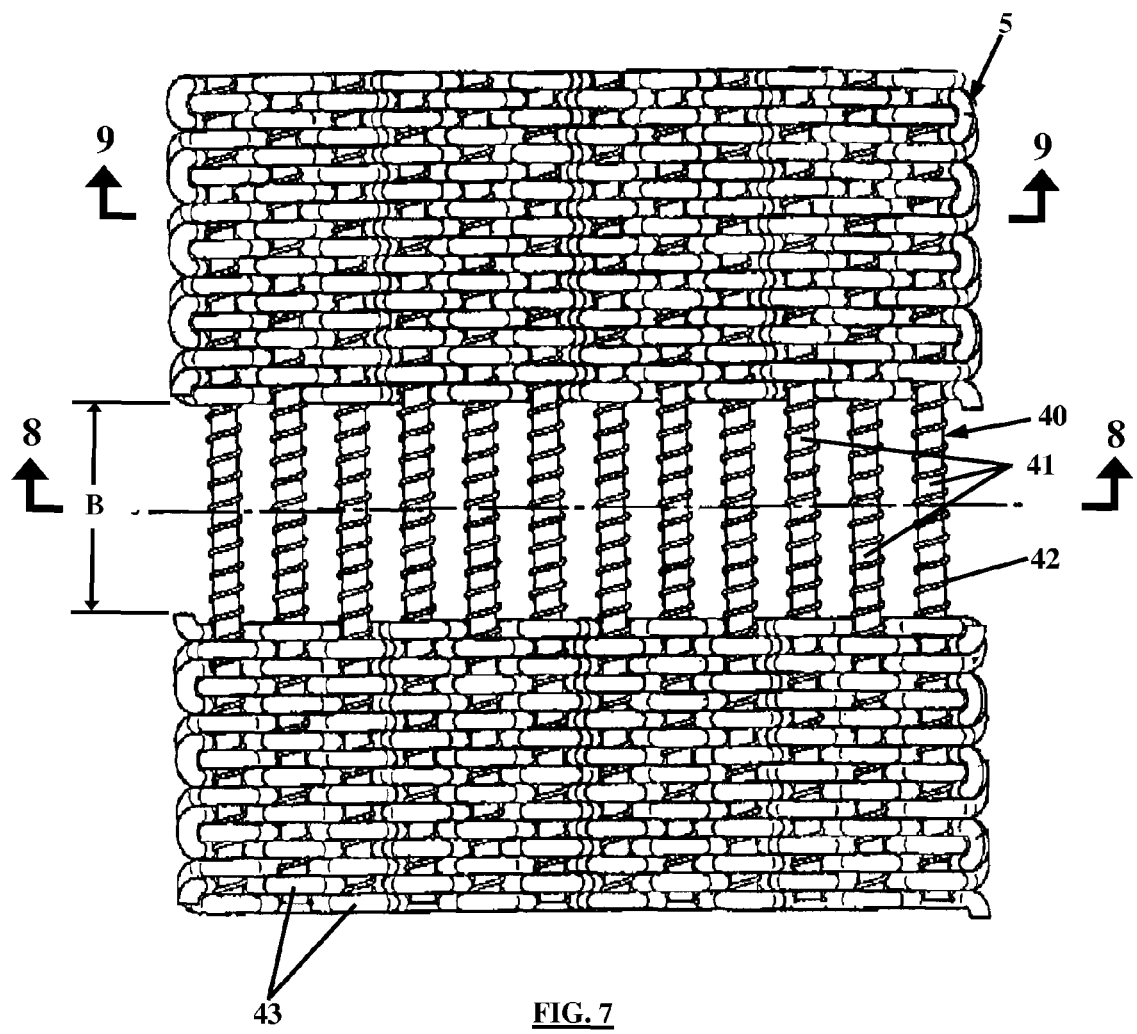
FIG. 7 is a top plan view of a partially conductive textile material with a contact region with width B in which the conductive threads/wires are made freely accessible, across the width of the partially conductive textile material.
Figure 9:
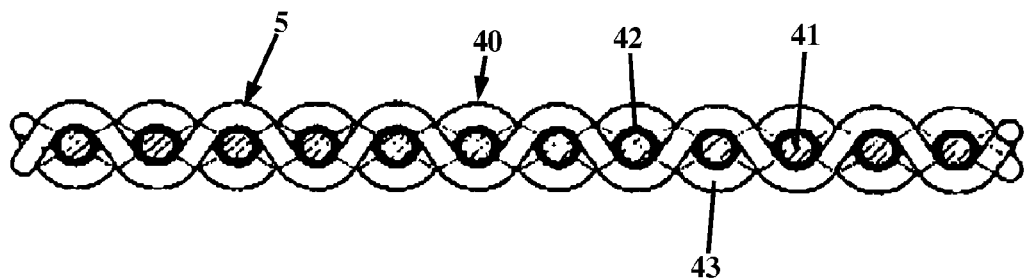

The partially conductive textile material 5 is preferably in the form of a strip, as shown in a top plan view in FIG. 7 and in a sectional view along line 9-9 from FIG. 7, in FIG. 9. The conductive threads/wires 40 extend in the material 5 in the longitudinal direction and, as shown, non-conductive threads 43 weave around said conductive threads/wires 40 in the transverse direction.

The conductive threads/wires 40 comprise an inner thread 41 with a conductor 42 being wound spirally around the inner thread 41. Preferably, the inner thread 41 is elastic and not conductive and is comprised of a plastic material. The conducting thread/wires 40 consist of metal, such as copper, and are wound on the inner thread 41.

Figure 10:
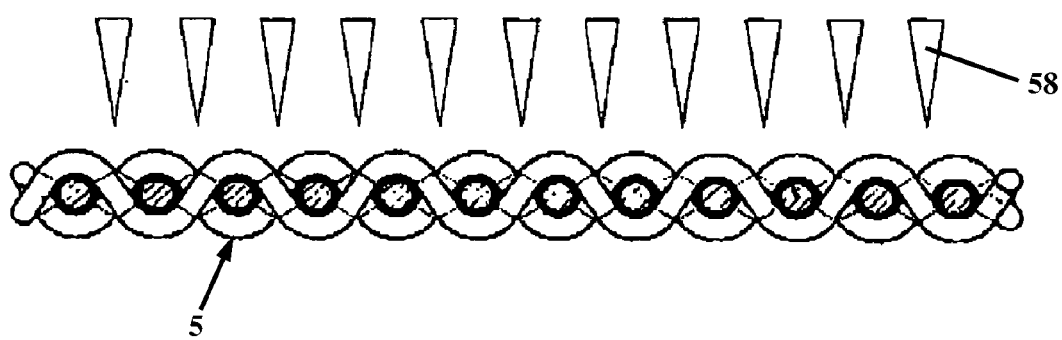
Figure 11:
Figure 12:
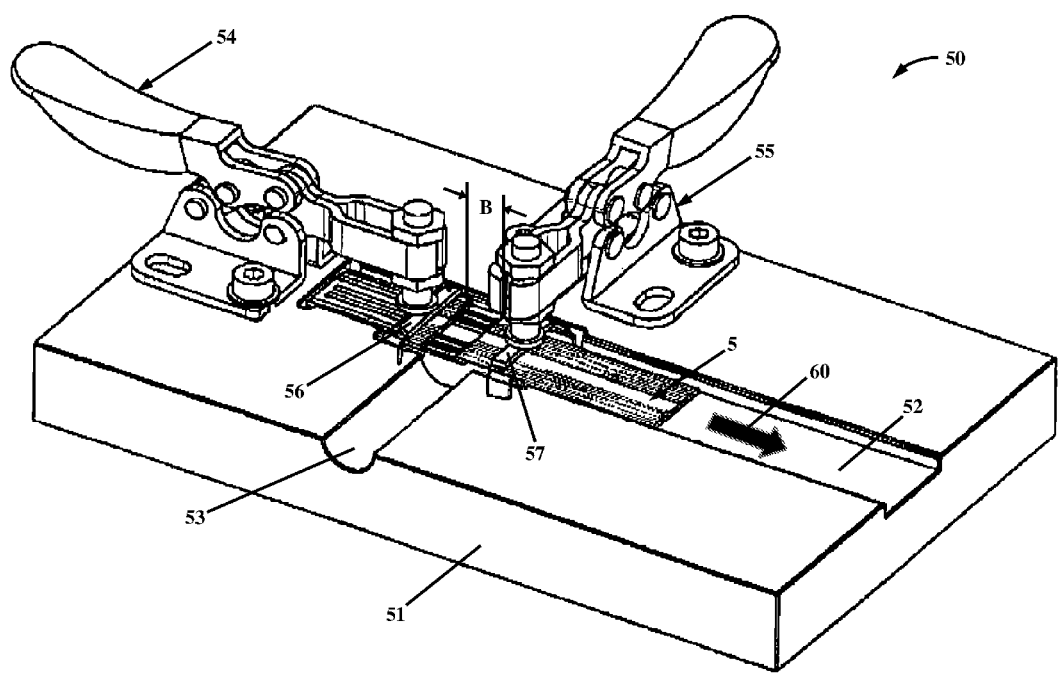
FIG. 12 is a top plan view of a tool, according to the invention for carrying out the inventive method.

FIGS. 9 through 11 disclose the steps of the method of the present invention. FIG. 12 discloses a tool 50 comprising a support plate 51 having a receiving groove 52 extending in the longitudinal direction. Transverse to the receiving groove 52 extends a transverse recess 53. Clamping members 54, 55 having clamp means (chucks) 56, 57 that are offset with respect to each other in the longitudinal direction are adapted to fixedly clamp to the material 5. The receiving groove 52 is widened in the area of the transverse recess 53 so as to provide for the receipt of the widened portions 125, 126, and 127 of the circuit board 12. For connecting to the material 5, i.e., for mounting the circuit board 12 at the conductive thread/wires 40 of the material 5, the circuit board 12 is placed in the areas or sections formed by the receiving groove 52 corresponding to the portions 125, 126, and 127 of the circuit board 12. Subsequently, the end of the material 5 to be connected is placed at a location where the widened portion 127 of the circuit board 12 ends and is clamped by means of the clamping member 54, i.e., the end of the material 5 is pressed downward onto the circuit board 12.

Figure 4:
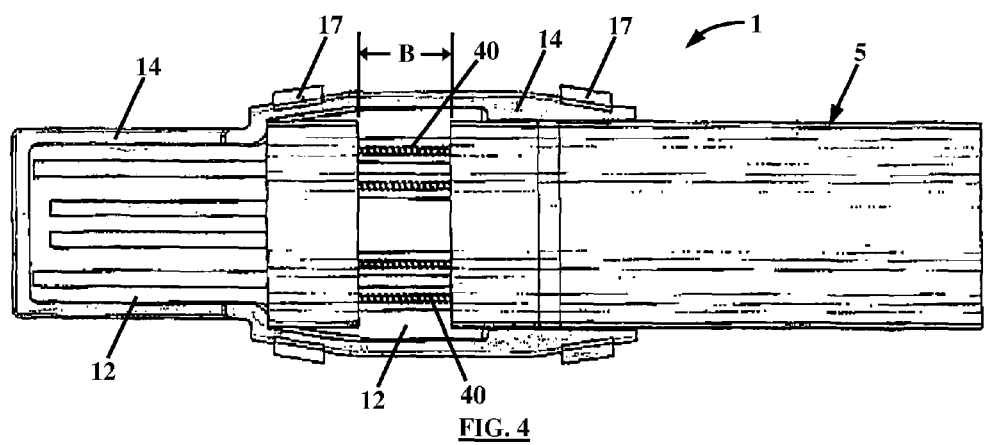
FIG. 4 is a top plan view similar to FIG. 1 with the cover of the connector removed.

Subsequently, the elastic material 5 is stretched preferably in the direction of the arrow 60. Then, the stretched material is fixedly clamped in the longitudinal direction, as shown in FIG. 12, by means of the clamping member 55 (if the material is not elastic, it will simply be taut). In the condition in which the material 5 is stretched and fixedly clamped, the contact region (width B) shown in FIGS. 4 and 12 is not yet present. That contact region is created in a later step of the method.

The section of the material 5 in the area of the transverse recess 53 in the stretched or taut condition corresponds to the representation of the material in FIG. 9.

The next method step is preferably the method step shown in FIG. 10 in which a plurality of teeth 58 of a tool (tool not shown in FIG. 10 is lowered such that the material 5 is pierced and stretched parallel to the conductive thread/wires 40, whereby the contact region with width B is opened up. The tension caused in the textile material 5 during stretching creates uniform spacing of the conductive thread/wires 40.

Figure 8:
FIG. 8 is a sectional view along line 8-8 shown in FIG. 7.

The next step involves the heating of the material 5 in the contact region of width B such that, following a sufficient degree of heating, the transverse threads 43 can be removed by a blowing action, which results in the contacting region with width B the condition shown in FIGS. 7, 8, and 12. In that condition, the conductive threads/wires 40 are exposed and are arranged in the area of the connecting tabs 122 of the circuit board 12. Subsequently, the individual conductive threads/wires 40 are soldered to the connecting tabs 122, i.e., the spiral shaped conductor 42 is soldered to the connecting tabs 122.

Following the soldering step, the material 5 can be inserted with the circuit board 12, which is soldered to the material 5, in the lower part 14 of the connector 1. The circuit board 12 and material 5 fit into the recess 18 of the lower portion 14. Thereupon, the circuit board 12 and the cover 16 are fixed together.

Alternatively, the recess in the tool 50, FIG. 12 can be designed such, that the lower part 14 of the connector can be placed in the tool 50 with the circuit board 12 and subsequently the method steps as described above can be carried out.

The invention claimed is:

1. A connector for textile materials having conductive threads comprising:
   a housing, and
   a termination element in the form of a circuit board;
   wherein said housing comprises a lower part and an upper part, said lower part being adapted to be mounted to said upper part,
   wherein a recess is formed in the lower part that is adapted to receive the circuit board and wherein
   the circuit board is received in the recess with connecting tabs of the circuit board facing upward;
   a contact region of a textile material that is connected to the circuit board is located in the area of the connecting tabs of the circuit board;

the textile material, is fixed adjacent to and on one side of the connecting tabs of the circuit board;

the textile material is stretched in one of a longitudinal direction and a direction of the conductive threads; and exposed conductive threads/wires at the contact region of the textile material are soldered to the connecting tabs of the circuit board.

2. The connector of claim 1, wherein the textile material is adapted to be elastically elongated in a longitudinal direction.

3. The connector of claim 1, wherein the conductive threads/wires comprise a non-conductive inner thread with a conductor wound spirally around the inner thread.

4. The connector of claim 1, wherein the lower part forming the recess comprises support surfaces for the circuit board.

5. The connector of claim 1, wherein teeth are formed in the lower part that are adapted to cooperate with teeth formed in the upper part.

6. The connector of claim 1, wherein circuit traces are formed on the circuit board and widen in an area of a contact or connecting tabs that are configured to connect to exposed conductive threads/wires of a textile material.

7. The connector of claim 3, wherein the conductive threads/wires are exposed where a non-conductive thread has been removed from the text material.

* * * * *